United States Patent
Haiut

(10) Patent No.: US 8,291,302 B2
(45) Date of Patent: Oct. 16, 2012

(54) STATE METRICS MEMORY REDUCTION IN A TURBO DECODER IMPLEMENTATION

(75) Inventor: Moshe Haiut, Ramat Gan (IL)

(73) Assignee: Marvell International Ltd., Hamilton (BM)

( * ) Notice: Subject to any disclaimer, the term of this patent is extended or adjusted under 35 U.S.C. 154(b) by 1034 days.

(21) Appl. No.: 12/285,987

(22) Filed: Oct. 17, 2008

(65) Prior Publication Data
US 2009/0103653 A1    Apr. 23, 2009

Related U.S. Application Data

(60) Provisional application No. 60/980,619, filed on Oct. 17, 2007.

(51) Int. Cl.
*H03M 13/00* (2006.01)
(52) U.S. Cl. ........................ 714/780; 714/796
(58) Field of Classification Search .................. 714/780, 714/796
See application file for complete search history.

(56) References Cited

U.S. PATENT DOCUMENTS

| | | | |
|---|---|---|---|
| 7,120,851 B2* | 10/2006 | Ting et al. | 714/755 |
| 2004/0153942 A1* | 8/2004 | Shtutman et al. | 714/755 |
| 2005/0021555 A1* | 1/2005 | Cameron et al. | 707/102 |
| 2005/0091566 A1* | 4/2005 | Berens et al. | 714/755 |
| 2005/0278603 A1* | 12/2005 | Berens et al. | 714/755 |
| 2006/0251184 A1* | 11/2006 | Cameron et al. | 375/295 |
| 2007/0118791 A1* | 5/2007 | Hepler et al. | 714/786 |
| 2007/0177696 A1* | 8/2007 | Chen et al. | 375/341 |

OTHER PUBLICATIONS

B. Vucetic et al., "Turbo Codes: Principles and Applications," The MAP Algorithm, 2000, Kluwer, XP002539819, pp. 138-147.
3GPP TS 36.212 V8.0.0 (2007-2009), 3$^{rd}$ Generation Partnership Project; Technical Specification Group Radio Access Network; Evolved Universal Terrestrial Radio Access (E-UTRA); Multiplexing and channel coding (Release 8), Internet Article, [online], Sep. 2007 (2007-2009), XP002539820, Retrieved from the Internet: URL:http://www.quintillion.co.jp/3GPP/Specs/36212-800.pdf> [retrieved on Aug. 3, 2009].

* cited by examiner

*Primary Examiner* — M. Mujtaba K Chaudry

(57) ABSTRACT

Methods and apparatus are described for reducing memory storage cells in a turbo decoder by storing only half the state metrics generated during a scan process. States associated with each bit transmission may be divided into couples and only one state from every state couple may be stored. In one example embodiment, only the state metric for a losing state of every state couple is saved, along with a single bit, e.g., 1 or 0, indicating whether the upper state or lower state of the state couple was the winner. The winning state may be reconstituted at a later stage. In this manner, for a code rate 1/3 and constraint length 3 turbo code, instead of storing 8*10=80 bits of state metrics for each systematic bit, only (4*10)+(4*1)= 44 bits of scan state metrics data need be stored, a savings of nearly 50% regardless of the transistor technology used.

28 Claims, 7 Drawing Sheets

STATE METRICS MEMORY REDUCTION IN A TURBO DECODER IMPLEMENTATION

INCORPORATION BY REFERENCE

This application claims the benefit of U.S. Provisional Application No. 60/980,619, "BETA MEMORY REDUCTION IN A TURBO DECODER IMPLEMENTATION," filed by Moshe Haiut on Oct. 17, 2007, which is incorporated herein by reference in its entirety.

BACKGROUND

Turbo coding of an outgoing digital data stream is one technique that may be used to mitigate the effect of RF distortion on a digital data transmission embedded within an RF signal. For example, emerging communications standards, e.g., 3rd Generation Partnership Project (3GPP) Long Term Evolution (LTE) standards, require that transceivers apply turbo coding to an outgoing data packet prior to transmission.

A rate ⅓ turbo encoder output includes three subblocks. The first subblock includes systematic bits, each systematic bit corresponding to a bit in the original data block received by the turbo encoder, the second subblock includes parity bits generated by a first recursive systematic convolutional (RSC) encoder engine within the turbo encoder that processed the original data block in a non-interleaved order, and the third subblock includes parity bits generated by a second RSC encoder engine within the turbo encoder that processed the original data block in an interleaved order.

A turbo decoder, included within a receiving device, may include two RSC decoders, each corresponding to the two RSC encoders of the turbo encoder, addressed above. The first RSC decoder may take as input the systematic bits and the parity bits produced by the first RSC encoder. The second RSC decoder may take as input the systematic bits in an interleaved order, as determined by an interleaver that uses a same turbo interleaving algorithm, $\pi$, used by, and the parity bits produced by, the second RSC encoder. In each iteration of the decoding process, each RSC decoder may output an improved estimate, e.g., extrinsic data in the form of a log-likelihood ratio (LLR), of the actual bit value represented by each systematic bit. Once the estimates generated by the two RSC decoders converge, or a predetermined number of decoding cycles have been performed, the final improved estimates may be interpreted, and transmitted from the decoder to a receiver signal processor as an output stream of decoded bit estimates.

The turbo-decoding algorithm includes multiple decoder iterations, each of which includes a non-interleaved half-iteration, followed by an interleaved half-iteration. Each half-iteration includes an alpha scan, in which the systematic bits are processed in a forward order, i.e., from first to last, and a beta scan, in which the systematic bits are processed in a reverse order, i.e., from last to first. The order in which the scans are performed depends on the implementation.

During a turbo decoding half-iteration, the beta scan and the alpha scan build and assess, respectively, a trellis logic table that is based on a series of possible logical states, e.g., binary 0 through binary 7 for rate ⅓ with constraint length 3 turbo code, that a transmitter may hold when the transmitter transmits a bit. For example, after transmitting a bit, a transmitter transitions from a state prior to the transmission, or prior-state, to one of two allowed future-states, depending on whether the systematic bit transmitted was a 0 or 1. Each allowed transition from a prior-state to a future-state represents a branch of the trellis table. For example, rate ⅓ with constraint length 3 turbo code generates a trellis table with 8 possible transmitter states, in which each of 8 prior-states can transition to 2 of 8 possible future-states, will include 16 possible branches linking the respective 8 possible prior-states to the respective 8 possible future-states that summarize the realm of transition possibilities associated with each bit transmission. In each half-iteration of the decoding process, the alpha scan may output an improved estimate, e.g., extrinsic data in the form of a log-likelihood ratio (LLR), of the actual bit value represented by each systematic bit, based on the trellis table transmitter state metrics determined during the beta scan.

The turbo decoding process uses successive half-iteration alpha and beta scans under interleaved and non-interleaved conditions to iteratively improve the accuracy of the state transitions represented by each respective half-iteration trellis table. For example, in each turbo decoder half-iteration, the turbo decoder uses a beta scan to build a trellis table based on the systematic soft-bit metrics received from a previous turbo half-iteration, and uses the alpha scan to generate improved systematic soft-bit metrics that are further processed in the next turbo decoder half-iteration process. After several iterations, confidence in the respective trellis state transitions typically converges, i.e., a consecutive string of high confidence state transitions emerge, thereby allowing each soft-bit in the received data packet to be determined with high confidence.

The multiplexing and channel coding standard adopted as part of the 3GPP LTE standards, e.g., 3GPP Technical Specification (TS) 36.212, allows data packets that may be one of 188 different sizes, ranging between 40-bit and 6144-bit, packages. Therefore, a trellis table, built during a beta scan phase of a half-iteration, having 8 possible states per transition and that stores a 10-bit state metric for each of the 8 possible states, may require as much as 8*10*6144, or nearly 500 Kbytes, of dynamic memory to support the respective beta scan storage requirements. Implementation of sufficient memory to support such a beta scan memory requirement may represent as much as one-half the total integrated circuit footprint of a turbo decoder hardware design.

SUMMARY

Aspects of this disclosure provide methods and apparatus that allow the memory storage requirements for trellis table transmitter state metrics, e.g., generated during a beta scan, to be reduced by nearly half, resulting in a turbo decoder hardware implementation that has a reduced hardware footprint.

The described methods and apparatus reduces the required number of beta-memory storage cells included within a turbo decoder hardware implementation to nearly half the original number by storing only 1 out of every 2 future-state metric values. To accomplish such a reduction in required memory cells, the future-states associated with each bit transmission may be divided into pairs, or couples, and only one state from every future-state couple may be stored in memory.

For example, during a half-iteration beta scan cycle of rate ⅓ turbo decoder, a next systematic soft-bit, and two related parity soft-bits may be retrieved from memory and compared against a bit pattern, e.g., 100, 011, associated with each of the respective branches of a trellis table to produce a branch metric for each branch of the trellis table, e.g., two branch metrics for each prior-state. The greater of the two branch metrics for each prior-state may be declared a winning state of the future-state couple, and the value of the winning future-state may be added to the determined winning branch metric to produce a state metric for the prior-state. Only the future-state metric for the losing future-state may be saved, along with a single bit, e.g., 1 or 0, indicating which future-state of the future-state pair was the winner. In this manner, instead of storing 8*10=80 bits of beta scan state metrics data for each systematic bit, only (4*10)+(4*1)=44 bits of beta scan state metrics data for each systematic bit need be stored. Therefore, the approach results in a savings of nearly 50% regardless of the transistor technology used.

During the alpha scan mode, the stored future-state metrics and winning state indicators may be retrieved from beta memory. The position of the winning future-state that was not stored in the future-state couple, may be determined based on the retrieved winning state indicator. For example, a winning state indicator of 0 may indicate that the winning state was the first state of the future-state couple, and a 1 may indicate that the winning state was the second state of the future-state couple. Therefore, a retrieved future-state metric with a winning state indicator of 0, may be stored as the second future-state metric of the reconstituted future-state pair, and the first future-state metric may be regenerated, while a retrieved future-state metric with a winning state indicator of 1, may be stored as the first future-state metric of the reconstituted future-state pair, and the second future-state metric may be regenerated.

In the beta scan process, a prior-state metric may be determined, for a prior-state that is connected to a winning future-state by a winning trellis branch, by adding the determined winning trellis branch metric to the winning future-state metric. Therefore, a winning future-state metric may be determined from a prior-state metric by reversing this process. Specifically, a winning future-state metric may be determined for a winning future-state that is connected to a prior-state by a winning trellis branch by subtracting the determined winning branch metric from the prior-state metric.

In one example embodiment, an RF receiver device containing a turbo decoder is described that may include, a systematic soft-bit data store that may store systematic soft-bits, a processing unit that may generate, during a scan cycle of a decoding scan operation, transmitter state metrics based on pairs of transmitter state metrics generated by the processing unit during a previous scan cycle of the decoding operation, systematic soft-bits retrieved from the systematic soft-bit data store, and a transmitter state transition trellis, a winning state determination module that may determine a winning transmitter state metric and a non-winning transmitter state metric in a pair of transmitter state metrics based on branch metrics generated by comparing a systematic bit with a branch bit pattern associated with each transmitter state metric in the pair by the transmitter state transition trellis, and a transmitter state data store that may be configured to store the non-winning transmitter state metric and a winning transmitter state indicator that may indicate which of the transmitter state metrics in the pair is the winning transmitter state metric.

In a second example embodiment, an RF receiver device containing a turbo decoder is described that may include, a systematic soft-bit data store that may store systematic soft-bits, at least one decoder engine including a decoding processing unit that may generate, during a scan cycle of a decoding operation, transmitter state metrics based on transmitter state metrics generated by the decoding processing unit during a previous scan cycle of the decoding operation, systematic soft-bits retrieved from the systematic soft-bit data store, and a transmitter state transition trellis, and a transmitter state data store that may be configured to store selected state metrics generated by the decoding processing unit and indicators of non-selected state metrics in a number of memory storage cells that may be insufficient for storing all of the transmitter state metrics generated by the decoding processing unit during the scan.

In a third example embodiment, a method of performing a soft-bit decoding scan cycle of a decoding scan operation is described that may include, defining a plurality of state pairs, the states within a state pair being connected by trellis branches to a common prior-state, determining a metric for a trellis branch between the states in the state pair and the common prior-state, determining a winning trellis branch metric based on the determined trellis branch metrics, determining a winning state and a losing state based on the determined winning trellis branch metric, determining a prior-state metric based on the winning state metric and the winning trellis branch metric, and storing the losing state metric and an indicator of the winning state metric.

In a fourth example embodiment, a method of performing a soft-bit decoding scan cycle of a decoding scan operation is described that may include, defining a plurality of transmitter prior-state pairs, each prior-state within a prior-state pair connected by trellis branches to a common pair of states, retrieving a state metric and a winning state indicator, for the common pair of states, determining a metric for a trellis branch between a selected prior-state of the prior-state pair and the winning state identified by the winning state indicator, and determining a metric for the winning state based on the selected prior-state and the determined trellis branch metric.

BRIEF DESCRIPTION OF THE DRAWINGS

Example embodiments of an RF receiver turbo decoding unit with reduced beta memory storage requirements will be described with reference to the following drawings, wherein like numerals designate like elements, and wherein.

DETAILED DESCRIPTION OF EMBODIMENTS

Figure 1:
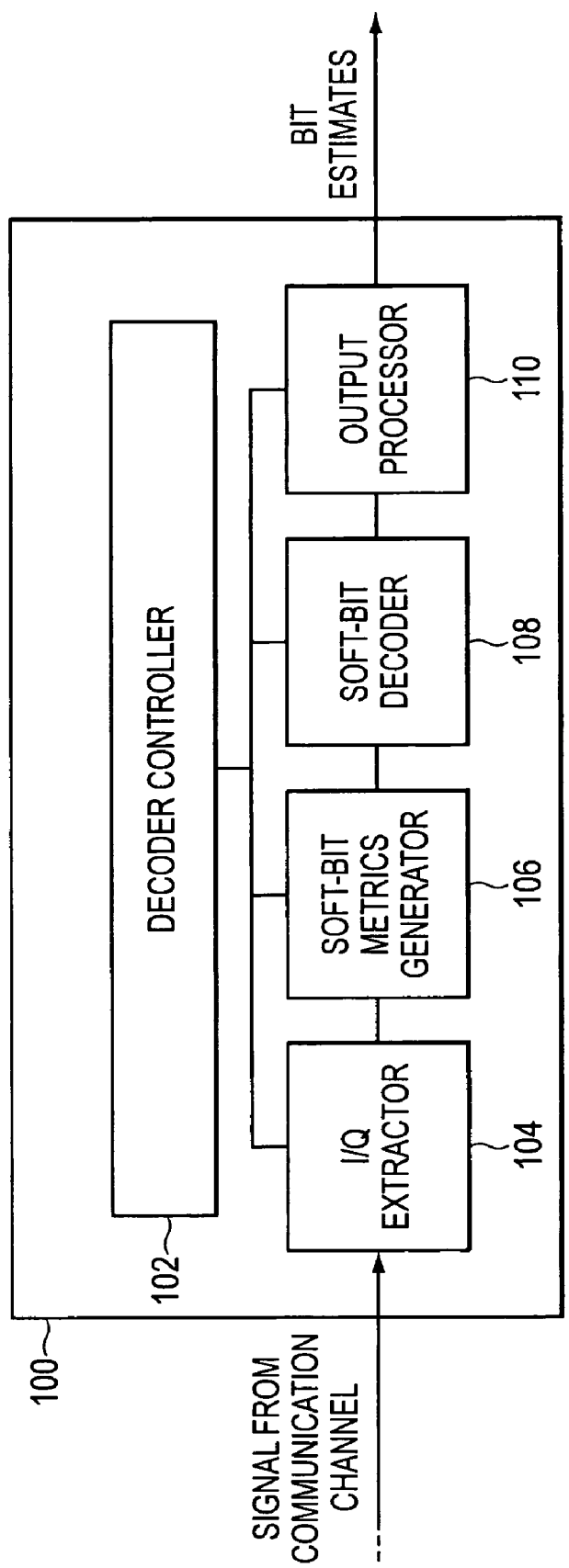
FIG. 1 is a block diagram of an example RF receiver turbo decoding unit that includes a soft-bit decoder with reduced beta memory storage requirements.

FIG. 1 is a block diagram of an example turbo code decoding unit that includes a soft-bit decoder with reduced scan memory requirements, for example, reduced beta scan memory. Such a turbo code decoding unit may be included in any RF receiver device, or in the receiver portion of any RF transceiver device. The turbo code decoding unit may be used to extract a stream of digital data encoded, for example, within a baseband frequency analog signal downconverted from a received RF signal. As shown in FIG. 1, turbo decoder 100 may include a decoder controller 102, an in-phase/quadrature (I/Q) extractor 104, a soft-bit metrics generator 106, a soft-bit decoder 108, and an output processor 110.

In operation, decoder controller 102 may receive and store control parameters from, for example, an RF communication device signal processor that controls operation of a receiver portion of an RF communication device, such as an RF receiver device or an RF transceiver device. Further, decoder controller 102 may communicate with each of I/Q extractor 104, soft-bit metrics generator 106, soft-bit decoder 108, and output processor 110 to provide the respective modules with control parameters that the respective modules may use to perform their respective signal processing functions.

I/Q extractor 104 may receive a baseband analog signal, for example, that has been downconverted from a received RF signal by other components in the RF receiver, and may extract in-phase and quadrature (I/Q) components from the received baseband analog signal. These signal I/Q components may be passed to soft-bit metrics generator 106.

Soft-bit metrics generator 106 may receive the extracted in-phase and quadrature (I/Q) components and may generate soft-bit estimates of the transmitted bits based on the I/Q information received and the receiver's adopted modulation approach. For example, based on the I/Q values received from I/Q extractor 104, soft-bit metrics generator 106 may generate a 5-6 bit series of 0's and 1's that corresponds to each bit within a received systematic bit subblock, a received non-interleaved parity subblock and an interleaved parity subblock. These systematic soft-bits, non-interleaved parity soft-bits and interleaved parity soft-bits may be passed to soft-bit decoder 108.

Details related to an example soft-bit decoder 108 are described in greater detail with respect to FIG. 2, below. In general, soft-bit decoder 108 may receive systematic, non-interleaved parity and interleaved parity soft-bits from soft-bit metrics generator 106 and may process the soft-bits using a turbo decoding process. Soft-bit decoder 108 may use multiple Bahl, Cocke, Jelinek and Raviv (BCJR) decoders, or BCJR engines, to iteratively improve extrinsic data for each soft-bit, e.g., in the form of a log-likelihood ratio (LLR) or other value, that provides a measure of likelihood regarding whether the soft-bit should be interpreted as a '0' or a '1.' Each BCJR engine may include modified alpha scan and beta scan processing circuitry that reduces the amount of memory required to support alpha scan and beta scan processing of each received systematic bit. In each half-iteration of the decoding process, the BCJR engines may output improved soft-bit extrinsic data. Once the extrinsic data generated by the convolutional decoders converge, or a predetermined number of decoding cycles has been performed, the soft-bit extrinsic data may be passed to output processor 110.

Output processor 110 may receive the final soft-bit extrinsic data, and parity data and may process the data to make a final determination regarding whether each soft-bit systematic bit should be interpreted as a '0' or a '1.' Based on the analysis of data received from soft-bit decoder 108, output processor 110 may generate a stream of bit best estimates, also referred to as symbol decisions, or hard-bits, that represent the final output of turbo decoding unit 100. The generated data stream may be transmitted to an RF receiver signal processor for further processing and/or transmitted to other components within the RF receiver device.

Figure 2:
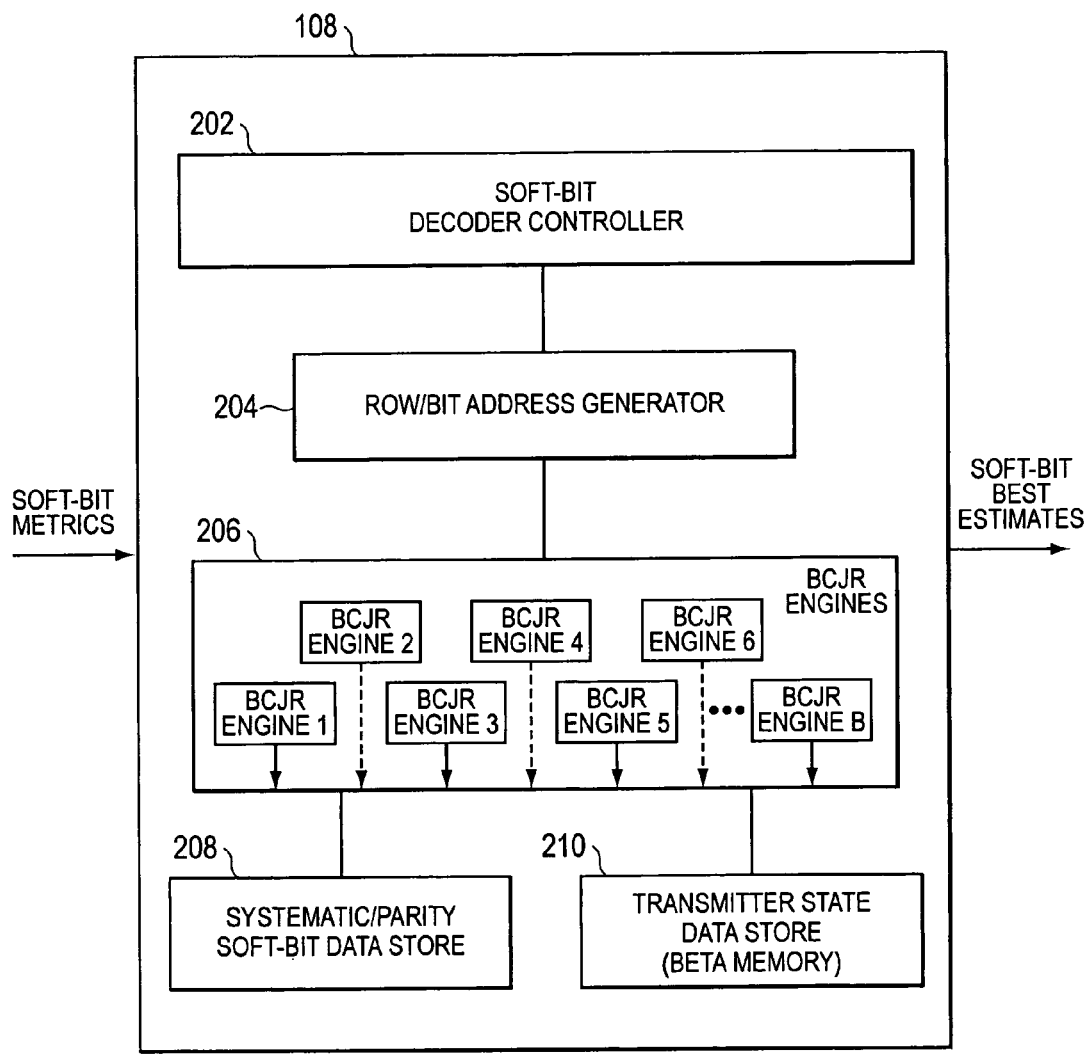
FIG. 2 is a detail block diagram of the example soft-bit decoder with reduced beta memory storage requirements introduced in FIG. 1.

FIG. 2 is a detail block diagram of the example soft-bit decoder 108 with reduced beta memory storage requirements. As shown in FIG. 2, soft-bit decoder 108 may include a soft-bit decoder controller 202, a row/bit address generator 204, multiple BCJR engines 206, a systematic/parity soft-bit data store 208, and a transmitter state data store, or beta memory, 210.

In operation, soft-bit decoder controller 202 may receive configuration and control parameters from decoder controller 102, and may use the received parameters to control operation of other modules within soft-bit decoder 108. Such configuration and control parameters may include a number of bits, K, represented within a received systematic bit subpacket, a first interleave parameter, f1, a second interleave parameter, f2, a number of rows that should be used to store a received systematic/parity bits in systematic/parity soft-bit data store 208, and/or a number of columns that should be used to store received systematic/parity bits in systematic/parity soft-bit data store 208.

Row/bit address generator 204 may provide the BCJR engines with conflict free memory access to systematic bits stored in systematic soft-bit data store 208, during both interleaved and non-interleaved, alpha and beta scans. For example, in one example embodiment of row/bit address generator 204 may use QPP based techniques, such as QPP state machines as described in U.S. patent application Ser. No. 12/285,992, entitled, "HARDWARE IMPLEMENTATION OF QPP INTERLEAVER," based on U.S. Provisional Application No. 60/980,626, "HARDWARE IMPLEMENTATION OF QPP INTER-LEAVER," filed by Moshe Haiut on Oct. 17, 2007, both of which are incorporated herein by reference in their entirety. However, the soft-bit decoder described in greater detail below may be used with any type of row/bit address generator and is not limited to use with QPP interleaved turbo decoders or decoders that use the state machine based QPP address generators. The described soft-bit decoder may be used in any decoder that uses an alpha scan and beta scan that performs an iterative trellis-based analyses to improve confidence in received soft-bit data.

Using the turbo decoding approach, the turbo decoding process may include multiple processing iterations, each iteration resulting in an incremental improvement in the extrinsic data for each systematic bit, i.e., the system obtains improved confidence regarding whether each respective systematic bit should be declared to be a hard-bit '0' or a hard-bit '1.' Once a sufficient level of confidence in the extrinsic data has been achieved, or a maximum number of decoder processing iterations have been performed, the decoding process is terminated and the soft-bits and resulting extrinsic data are passed to output processor 110, to be declared either a hard-bit '0' or a hard-bit '1.'

BCJR engines 206 may include multiple BCJR convolutional decoders. During the decoding of a newly received set of data packet systematic bits, each convolutional BCJR engine may perform multiple correlation iterations based on data addresses provided by row/bit address generator 204. For example, each decoder iteration may include a non-interleaved half-iteration and an interleaved half-iteration. Each half-iteration may include a reverse scan, or beta scan, and a forward scan, or alpha scan. Each scan may include multiple cycles, one cycle per row in the stored systematic bit data.

During a single cycle, multiple BCJR engines may work in parallel to process a single row of systematic bits in the stored systematic bit data. In one example embodiment of soft-bit decoder 108, each BCJR engine may determine which systematic bit it should process in the next processing cycle based on a row address and column address provided by bit/address generator 204. In another example embodiment of soft-bit decoder 108, the row/bit address generator 204, after having determined a row/column address for each BCJR engine, may retrieve the systematic bits for the identified row, and may provide each respective BCJR engine with the systematic bit that should be processed in the next processing cycle.

The next row/column address provided by row/bit address generator 204 to a BCJR engine may depend on the current operating mode of the soft-bit decoder 108. For example, when operating in non-interleaved/alpha scan mode, the columns/rows of the systematic table may be addressed in a sequential forward order, i.e., the next systematic bit to be processed by a BCJR processor may be determined by incrementing the current row, since each BCJR processes the same column for the duration of the non-interleaved half-iteration. When operating in non-interleaved/beta scan mode, the columns/rows of the systematic table may be addressed in a sequential reverse order, i.e., the next systematic bit to be processed by a BCJR processor may be determined by decrementing the current row, since each BCJR processes the same column for the duration of the non-interleaved half-iteration.

However, when operating in interleaved mode, during an interleaved half-iteration, the next row to be processed and the assignment of columns within the selected row may both be pseudo-randomly interleaved in accordance with an interleaving algorithm. Therefore, when operating in interleaved/beta scan mode, the next row of the systematic table may be determined by row/bit address generator 204 using an interleaving approach that matches that of the encoder used to encode the received systematic and parity bits prior to transmission. The initialized parameters used in row/bit address generator 204 may vary depending on whether soft-bit decoder 108 is operating in alpha scan or beta scan mode and whether soft-bit decoder 108 is operating in interleaved or non-interleaved mode.

Each decoder half-iteration may include an alpha scan and a beta scan. At the start of a decoder half-iteration, a decoder beta scan may commence that includes multiple beta scan cycles. During each beta scan cycle, one row of systematic data may be processed. In each beta scan cycle, each of the BCJR engines may process a single systematic soft-bit and corresponding parity soft-bits. Following completion of a beta scan cycle, a new beta scan cycle may be initiated until all rows of systematic data have been processed, at which time the decoder half-iteration beta scan is completed.

Upon completion of a decoder half-iteration beta scan, a decoder half-iteration alpha scan may commence that includes multiple alpha scan cycles. In each alpha scan cycle, each of the BCJR engines may process a systematic soft-bit and corresponding parity soft-bits. Following completion of an alpha scan and a beta scan for a decoder non-interleaved half-iteration, and completion of an alpha scan and a beta scan for a decoder interleaved half-iteration, the decoder iteration is complete.

Following completion of a decoder iteration, the soft-bit decoder controller may assess the respective extrinsic data to determine whether the extrinsic data has sufficiently converged, so that the decoding process may be terminated. For example, if the soft-bit decoder controller determines that a sufficient number of systematic bits may be converted with high confidence in the resulting hard-bit value, the decoding process may be terminated and the resulting systematic soft-bits may be passed to output processor 110.

Figure 3:
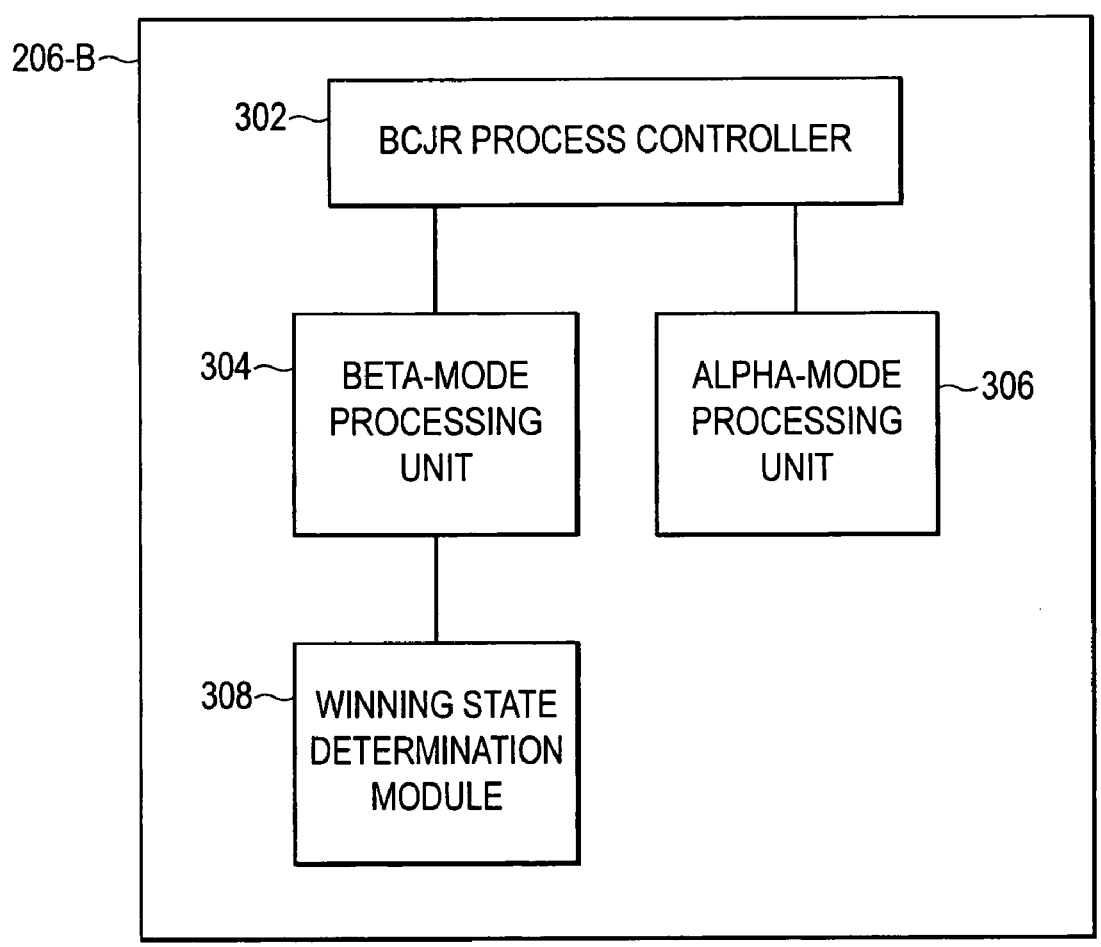
FIG. 3 is a detail block diagram of the example Bahl, Cocke, Jelinek and Raviv (BCJR) engines introduced in FIG. 2.

FIG. 3 is a block diagram of an example BCJR engine described above with respect to FIG. 2. As shown in FIG. 3, an individual BCJR engine within the one or more BCJR engines included in soft-bit decoder 108, as described above with respect to FIG. 2, may include a BCJR process controller 302, a beta-mode processing unit 304, an alpha-mode processing unit 306, and a winning state determination module 308.

In operation, BCJR process controller 302 may receive from soft-bit decoder controller 202, an indication of the current turbo decoder processing mode e.g., alpha-scan mode or beta-scan mode. Further, BCJR process controller 302 may receive from row/bit address generator 204 either a systematic soft-bit, e.g., a systematic soft-bit and two parity bits, or a row/column address for a systematic soft-bit that is to be retrieved by BCJR process controller 302 from systematic/parity soft-bit data store 208. If the current turbo decoder processing mode is beta-scan mode, BCJR process controller 302 may submit the systematic soft-bit to beta-mode processing unit 304 for processing as described below. If the current turbo decoder processing mode is alpha-scan mode, BCJR process controller 302 may submit the systematic soft-bit to alpha-mode processing unit 306 for processing as described below. Read/write operations required by beta-mode processing unit 304 and alpha-mode processing unit 306 to systematic/parity soft-bit data store 208 and/or transmitter state data store (beta memory) 210 may also be performed via BCJR process controller 302.

As described above, the turbo-decoding algorithm includes multiple decoder iterations, each of which consists of a non-interleaved half-iteration, followed by an interleaved half-iteration. Each half-iteration includes a beta scan, in which the systematic bits are processed in a reverse order, i.e., from last to first, followed by an alpha scan, in which the systematic bits are processed in a forward order, i.e., from first to last. During each turbo decoding half-iteration, the beta-mode processing unit 304 and alpha-mode processing unit 306 build and assess, respectively, a trellis logic table that is based on a series of possible logical states, e.g., binary 0 through binary 7, that a transmitter may hold when a transmitter transmits a bit. In each half-iteration of the decoding process, the alpha scan may output an improved estimate, e.g., extrinsic data in the form of a log-likelihood ratio (LLR), of the actual bit value represented by each systematic bit, based on the trellis table transmitter state metrics determined during the beta scan.

If the current turbo decoder processing mode is beta-scan mode, BCJR process controller 302 may submit a received systematic soft-bit to beta-mode processing unit 304 for processing. Details related to example trellis based processing that may be performed by beta-mode processing unit 304 are described in greater detail with respect to FIG. 4 and FIG. 6, below. In one example embodiment, beta-mode processing unit 304 may invoke winning state determination module 308 to compare the received systematic bit, e.g., 1 systematic bit and 2 parity bits, against a bit pattern, e.g., 100, 011, associated with each of the respective branches of a trellis table to produce a branch metric for each branch of the trellis table, thereby creating two branch metrics for each prior-state. The greater of the two branch metrics for each prior-state may be declared by winning state determination module 308 to be a winning state of the future-state couple, and the value of the winning future-state may be added to the determined winning branch metric to produce a state metric for the prior-state. Beta-mode processing unit 304, e.g., via BCJR process controller 302, may save in transmitter state data store (beta memory) 210, only the future-state metric for the losing future-state and a single bit, e.g., 1 or 0, indicating whether a first future-state or a second future-state of the future-state pair was the winner. In this manner, for rate ⅓ turbo code with constraint length 3, instead of storing 8*10=80 bits of beta scan state metrics data for each systematic bit, only (4*10)+(4*1)=44 bits of beta scan state metrics data for each systematic bit need be stored. Therefore, the approach results in a savings of nearly 50% regardless of the transistor technology used.

If the current turbo decoder processing mode is alpha-scan mode, BCJR process controller 302 may submit a received systematic soft-bit to alpha-mode processing unit 304 for processing. Details related to example trellis based processing that may be performed by alpha-mode processing unit 306 are described in greater detail with respect to FIG. 4 and FIG. 7, below. In one example embodiment, alpha-mode processing unit 306 may retrieve, from transmitter state data store (beta memory) 210, the stored losing future-state metrics and winning state indicators associated with the transmitter future-states, following transmission of the currently selected systematic soft-bit. The winning future-state metrics which were not stored and their position within the sequence of future-states, maybe determined based on their retrieved order from beta memory and the retrieved winning state indicators. For example, a winning state indicator of 0 may indicate that the winning state was the first state of a future-state couple, and a 1 may indicate that the winning state was the second state of the future-state couple. Therefore, a retrieved future-state metric with a winning state indicator of 0, may be stored as the second future-state metric of the reconstituted future-state pair, and the first future-state metric may be regenerated, while a retrieved future-state metric with a winning state indicator of 1, may be stored as the first future-state metric of the reconstituted future-state pair, and the second future-state metric may be regenerated.

As described above, a prior-state metric may be determined, by beta-mode processing unit 304, for a prior-state that is connected to a future-state by a trellis branch by adding the determined winning branch metric to the winning future-state metric. Therefore, a winning future-state metric may be determined, by alpha-mode processing unit 306, from a prior-state metric by reversing this process. Specifically, a future-state metric may be determined for a winning future-state that is connected to a prior-state by a winning trellis branch by subtracting the determined winning branch metric from the prior-state metric. Once alpha-mode processing unit 306 has reconstituted the future-state metrics associated with the transmission of the currently selected systematic bit, and therefore has access to all prior-state and future-state metrics associated with the transmission of the currently selected bit, alpha-mode processing unit 306 may generate and an improved estimate, e.g., extrinsic data in the form of a log-likelihood ratio (LLR), of the actual bit value represented by the currently selected systematic bit.

Figure 4:
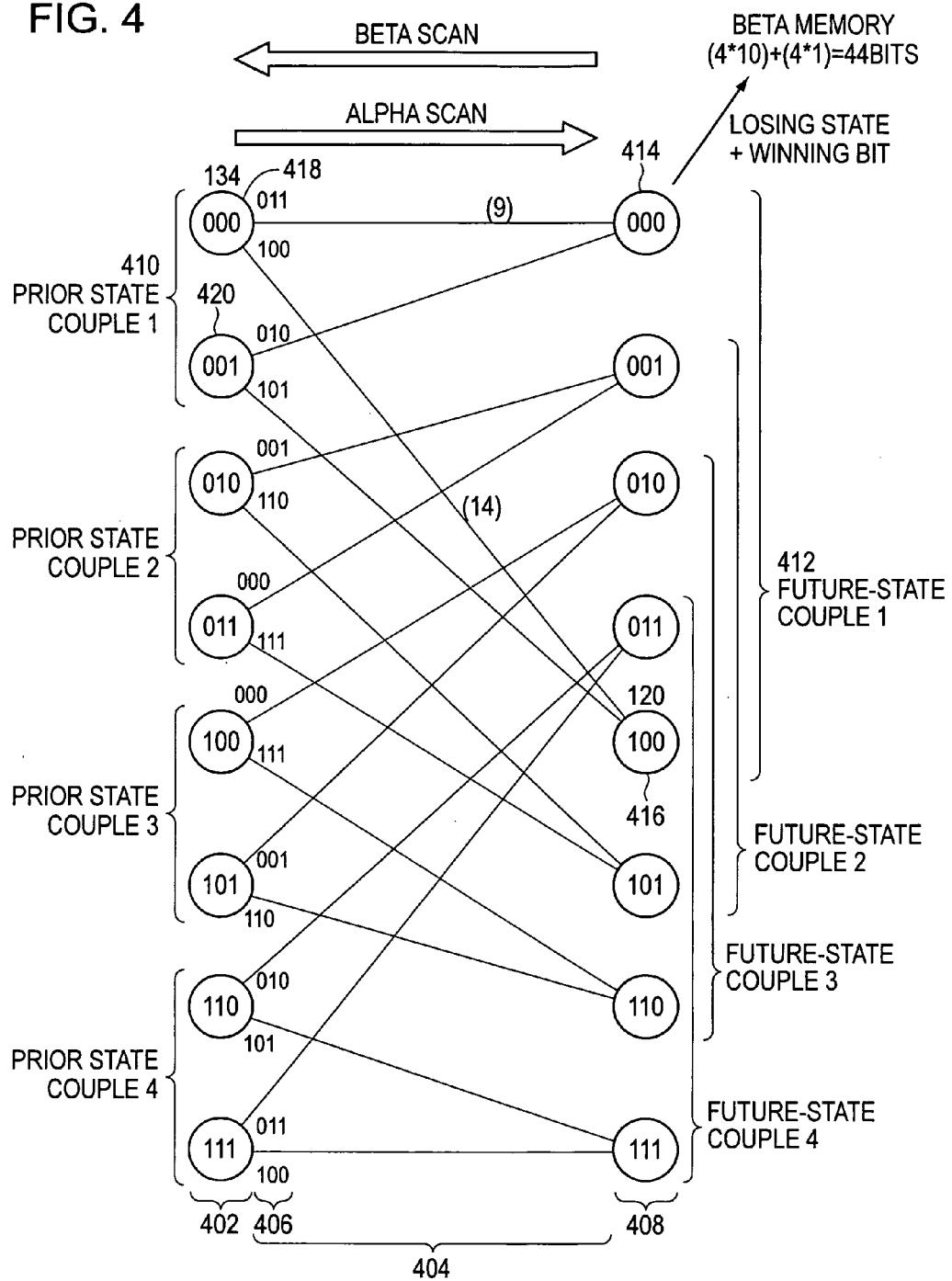
FIG. 4 is a schematic of an example turbo decoder trellis.

FIG. 4 is a schematic of an example of a portion of a rate ⅓ with constraint length 3 turbo decoder trellis that may be used during the soft-bit decoder process, described above. As shown in FIG. 4, an example trellis may include prior-states 402, trellis branches 404, trellis branch bit sequences 406 and future-states 408. As further shown in FIG. 4, future-states may be organized into future-state couples, e.g., future-state couple 412 that may include future-state 414 and future-state 416, and prior-state couples, e.g., prior-state couple 410 that may include prior-state 418 and prior-state 420. In addition, prior to alpha/beta scan processing, each trellis branch 404, may be assigned a trellis bit sequences 406. For example, as shown in FIG. 4, the trellis branch between prior-state 418 and future-state 414 has an assigned trellis branch bit sequence of 011, and the trellis branch between prior-state 418 and future-state 416 has an assigned trellis branch bit sequence of 100.

Shown in FIG. 4 are all possible transmitter prior-states 402 and all possible transmitter future-states 408 associated with the transmission of a single systematic bit. Each possible state is represented as a node, and trellis branches 404 connect the respective prior-states to the respective future-states. Each path represents an allowed transmitter state transition in response to the transmission of either a 0 or a 1 by a transmitter at each of the respective prior-states. For example, as a result of prior bit transmissions a transmitter may be at prior-state 418. If the transmitter transmits a 0, the transmitter will transition to state 414, however, if the transmitter transmits a 1, the transmitter will transition to state 416. Prior and future bit transmissions result in similar transmitter state transitions. FIG. 4, presents, for explanatory purposes, a single state transition associated with a single bit transmission. A full trellis mapping of the state transitions associated with the transmission of a data packet may have one such trellis transition for each bit transmitted. The trellis states, trellis branches, and assigned trellis branch bit sequences, however, may remain the same for each segment of such a full trellis mapping. However, the metrics assigned to each state, for each transition may vary depending on the history of prior bits transmitted and the value of each respective bit transmitted.

For example, in a beta scan mode, as indicated in FIG. 4, the systematic bits associated with a received data packet are processed in a reverse direction, i.e., from last to first, to determine metrics for states prior to the transmission of the currently selected bit. Once the prior-state bits are determined, the future-state metrics are saved to beta memory, and the determined prior-state metrics serve as the future-state metrics for the next beta scan cycle, i.e., the next systematic bit processed. In an alpha scan mode, as indicated in FIG. 4, the systematic bits associated with a received data packet are processed in a forward direction, i.e., from first to last, and the state metrics associated with both the prior-state and future-state are known, i.e., retrieved and/or regenerated from data stored in beta memory. Therefore, in alpha scan mode, state transitions may be selected based on the most recent state metrics, improved bit estimates, e.g., extrinsic data in the form of a log-likelihood ratio (LLR), of the actual bit value represented by each systematic bit, based on the trellis table transmitter prior-state and future-state metric may be generated and saved.

Figure 5:
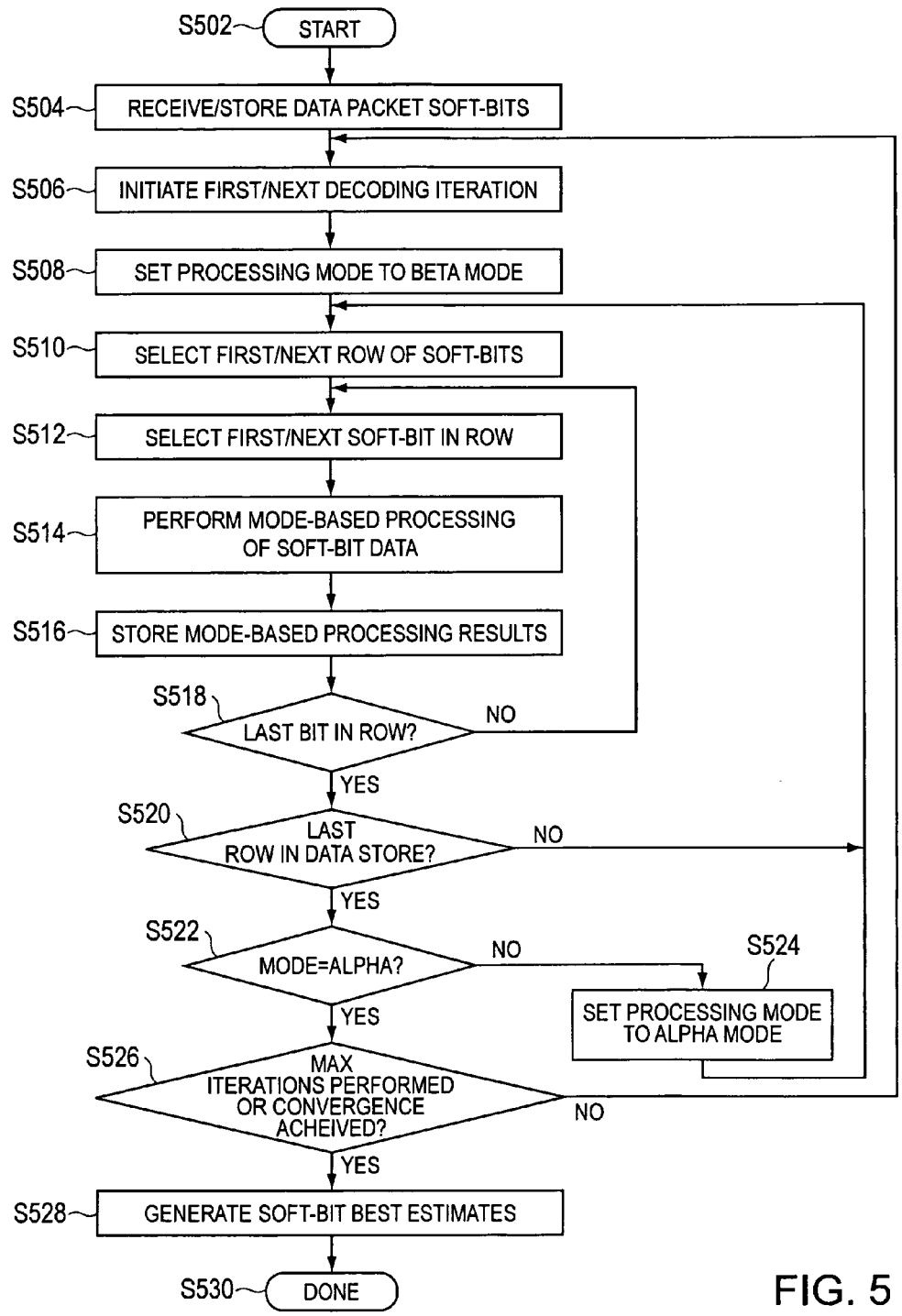
FIG. 5 is a flow-chart of an example turbo decoding process that may be performed by the example soft-bit decoder introduced in FIG. 2.

FIG. 5 shows a flow-chart of an example turbo decoding process that may be performed by the example soft-bit decoder introduced in FIG. 2. As shown in FIG. 5, operation of the method begins at step S502 and proceeds to step S504.

In step S504, the soft-bit decoder controller 202 may receive and store in systematic/parity soft-bit data store 208 soft-bits encoded in a received data packet, and operation of the method continues to step S506.

In step S506, soft-bit decoder controller 202 may initiate a first turbo decoding iteration, and operation of the method continues to step S508.

In step S508, soft-bit decoder controller 202 may set the decoder processing mode to beta scan mode, and operation of the method continues to step S510.

In step S510, row/bit address generator 204 may determine a row address of a first row of soft-bits stored in system/parity soft-bit data store 208, and operation of the method continues to step S512.

In step S512, row/bit address generator 204 may determine a column, or bit address, within the determined row address, and operation of the method continues to step S514.

In step S514, based on the currently selected processing mode, one of beta-mode processing unit 304 and alpha-mode processing unit 306 may be invoked by BCJR process controller 302 to perform mode based processing, e.g., alpha scan cycle processing as described below with respect to FIG. 7, or beta scan cycle processing as described below with respect to FIG. 6, and operation of the method continues to step S516.

In step S516, the result of the mode based processing may be stored, and operation of the method continues to step S518.

If, in step S518, soft-bit decoder controller 202 determines that all bits in a row have been processed, operation of the method continues to step S520, otherwise, operation of the method continues to step S512.

If, in step S520, soft-bit decoder controller 202 determines that the last row of soft-bits stored in systematic/parity soft-bit data store 208 as been processed, operation of the method continues to step S522, otherwise, operation of the method continues to step S510.

If, in step S522, soft-bit decoder controller 202 determines that the current operating mode is alpha mode, operation of the method continues to step S526, otherwise, operation of the method continues to step S524.

In step S524, the current operating mode is set to alpha mode, and operation of the method continues to step S510.

If, in step S526, soft-bit decoder controller 202 determines that a maximum number of turbo decoding iterations has been performed, or that convergence has been achieved, operation of the method continues to step S528, otherwise, operation of the method continues to step S506.

In step S528, soft-bit decoder controller 202 may generate and store soft-bit best estimates to output processor 110, as described above with respect to FIG. 1, and operation of the method terminates.

Figure 6:
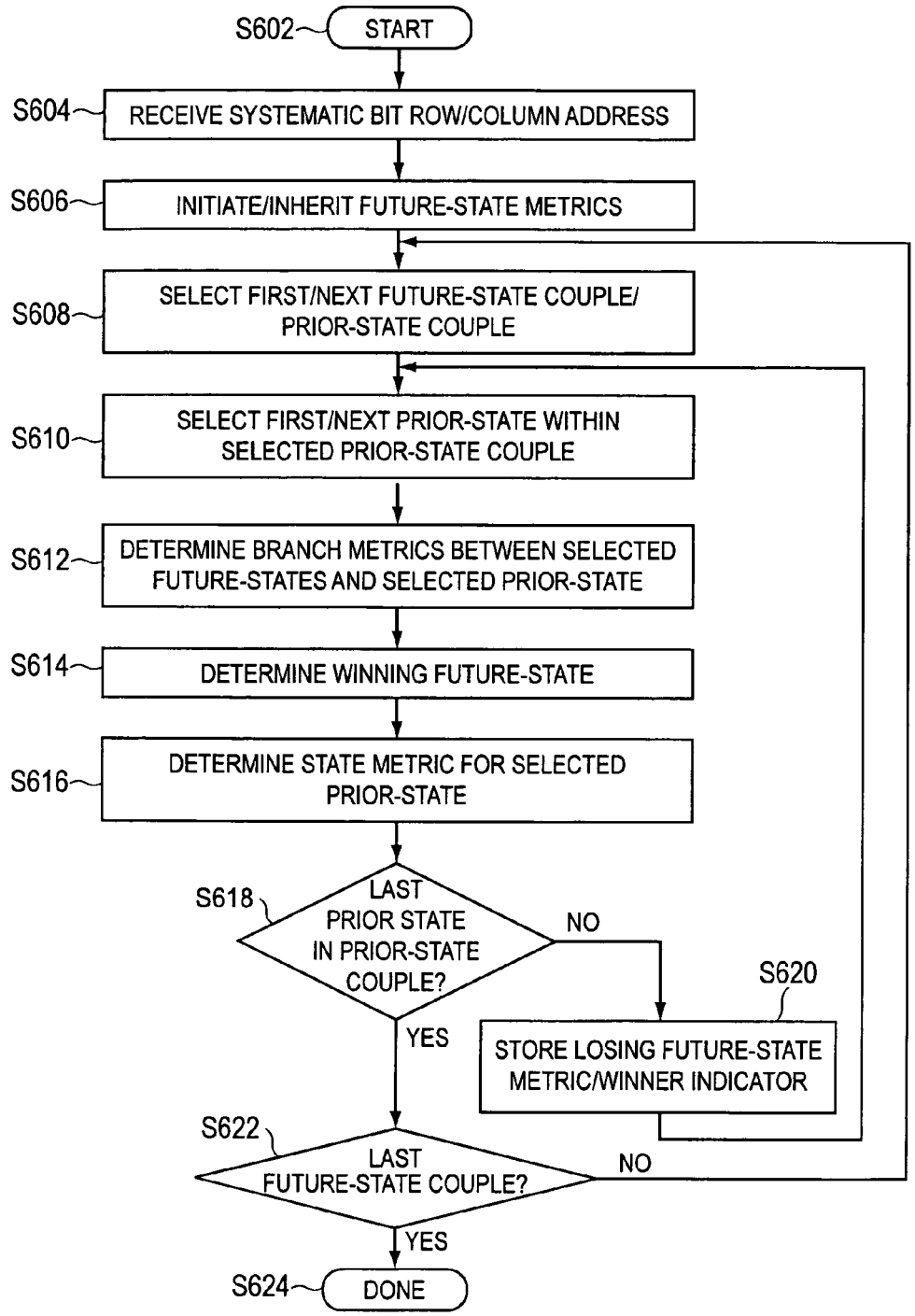
FIG. 6 is a flow-chart of an example beta scan cycle performed within a half-iteration beta scan.

FIG. 6 shows a flow-chart of an example turbo decoding process that may be performed by the example beta-mode processing unit 304, described above with respect to FIG. 3. As shown in FIG. 6, operation of the method begins at step S602 and proceeds to step S604.

In step S604, beta-mode processing unit 304 may receive a systematic/parity soft-bit, e.g., 1 systematic bit and 2 parity bits, as either an address that may be used to retrieve the systematic/parity soft-bit from systematic/parity soft-bit data store 208, or as an actual systematic/parity soft-bit retrieved from memory by, for example, row/bit address generator 204 or BCJR process controller 302, and operation of the method continues to step S606.

In step S606, beta-mode processing unit 304 may assess the metrics associated with the possible future-states of the current received soft-bit, and operation of the method continues to step S608.

In step S608, beta-mode processing unit 304 may select a first/next future-state couple and a first/next prior-state couple, described above with respect to FIG. 4, and operation of the method continues to step S610.

In step S610, beta-mode processing unit 304 may select a first/next prior-state from the selected prior-state couple, and operation of the method continues to step S612.

In step S612, beta-mode processing unit 304 may compare the current soft-bit/parity bits to the trellis branch bit sequences, described above with respect to FIG. 4, associated with the respective trellis branches connecting the respective future-states of the selected future-state couple to the selected prior-state, to produce a branch metric for each of the respective trellis branches, and operation of the method continues to step S614.

In step S614, beta-mode processing unit 304, e.g., via winning state determination module 308, may select a winning future-state based on a comparison of the respective branch metrics, and operation of the method continues to step S616.

In step S616, beta-mode processing unit 304 may determine a state metric for the selected prior-state based on the winning future-state metric and the winning branch metric, e.g., by adding the winning future-state metric to the winning branch metric, and operation of the method continues to step S618.

If, in step S618, beta-mode processing unit 304 determines that the last prior-state in the selected prior-state couple has been selected, operation of the method continues to step S622, otherwise, operation of the method continues to step S620.

In step S620, beta-mode processing unit 304 may store the losing future-state metric, and a 1-bit that indicates the position of the winning future-state metric in the selected future-state couple, in the transmitter state data store (beta store), described above with respect to FIG. 2, and operation of the method continues to step S610.

If, in step S622, beta-mode processing unit 304 determines that the last future-state couple has been selected, operation of the method continues to step S624 and terminates, otherwise, operation of the method continues to step S608.

Figure 7:
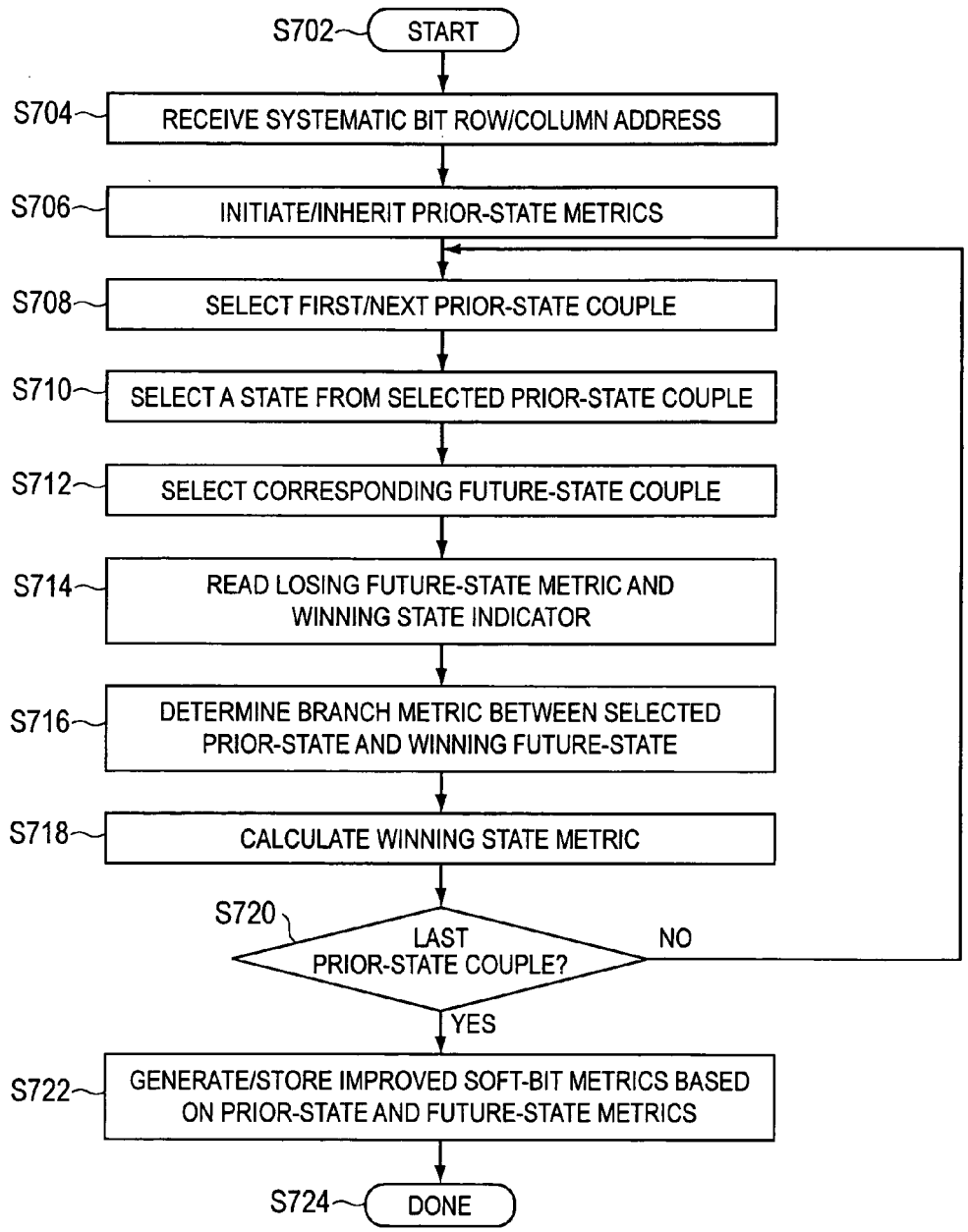
FIG. 7 is a flow-chart of an example alpha scan cycle performed within a half-iteration alpha scan.

FIG. 7 shows a flow-chart of an example turbo decoding process that may be performed by the example alpha-mode processing unit 306, described above with respect to FIG. 3. As shown in FIG. 7, operation of the method begins at step S702 and proceeds to step S704.

In step S704, alpha-mode processing unit 306 may receive a systematic/parity soft-bit, e.g., 1 systematic bit and 2 parity bits, as either an address that may be used to retrieve the systematic/parity soft-bit from systematic/parity soft-bit data store 208, or as an actual systematic/parity soft-bit retrieved from memory by, for example, row/bit address generator 204 or BCJR process controller 302, and operation of the method continues to step S706.

In step S706, alpha-mode processing unit 306 may assess the metrics associated with the possible prior-states of the current received soft-bit, as described above with respect to FIG. 4, and operation of the method continues to step S708.

In step S708, alpha-mode processing unit 306 may select a first/next prior-state couple, described above with respect to FIG. 4, and operation of the method continues to step S710.

In step S710, alpha-mode processing unit 306 may select a prior-state from the selected prior-state couple, and operation of the method continues to step S712.

In step S712, alpha-mode processing unit 306 may select a corresponding future-state couple, and operation of the method continues to step S714.

In step S714, alpha-mode processing unit 306 may read from the transmitter state data store (beta store), described above with respect to FIG. 2, the losing future-state metric and winner indicator for the current future-state couple, and operation of the method continues to step S716.

In step S716, alpha-mode processing unit 306 may determine a branch metric for the trellis branch between the selected prior-state and the winning future-state, e.g., by comparing the current soft-bit/parity bits to the trellis branch bit sequence for the trellis branch, and operation of the method continues to step S718.

In step S718, alpha-mode processing unit 306 may determine state metric for the winning future-state metric based on the determined trellis branch metric and the metric of the selected prior-state, e.g., by adding the determined trellis branch metric to the selected prior-state metric, and operation of the method continues to step S720.

If, in step S720, alpha-mode processing unit 306 determines that the last prior-state couple has been selected, operation of the method continues to step S722, otherwise, operation of the method continues to step S708.

In step S722, alpha-mode processing unit 306 may generate extrinsic data, e.g., in the form of a log-likelihood ratio (LLR) of the actual bit value represented by the current systematic bit, and may store the extrinsic data, e.g., as a revised systematic soft-bit within systematic/parity soft-bit data store 208, and operation of the method terminates.

In the examples above, the described decoding methods and apparatus are described with respect to a rate ⅓ decoder with a constraint length 3 turbo code which, therefore, makes use of a trellis table with 8 possible transmitter states. However, such embodiments are examples only. The described methods and apparatus may be used with a convolutional code having any code rate and any code constraint length.

In the examples above, the described decoding methods and apparatus are described with respect to beta scan cycles of a turbo decoding process. However, such embodiments are examples only. The described methods and apparatus may be used in a similar manner during alpha scan cycles of a turbo decoding process.

For purposes of explanation in the above description, numerous specific details are set forth in order to provide a thorough understanding of the soft-bit decoder with reduced memory storage requirements and the turbo decoder in which the soft-bit decoder may be used. It will be apparent, however, to one skilled in the art that the soft-bit decoder with reduced memory storage requirements and the turbo decoder in which the soft-bit decoder may be used may be practiced without these specific details. In other instances, well-known structures and devices are shown in block diagram form in order to avoid obscuring the features of the soft-bit decoder with reduced memory storage requirements and the turbo decoder in which the soft-bit decoder may be used.

While the soft-bit decoder with reduced memory storage requirements and the turbo decoder in which the soft-bit decoder may be used have been described in conjunction with the specific embodiments thereof, it is evident that many alternatives, modifications, and variations will be apparent to those skilled in the art. Accordingly, embodiments of the soft-bit decoder with reduced memory storage requirements and the turbo decoder in which the soft-bit decoder may be used, as set forth herein, are intended to be illustrative, not limiting. There are changes that may be made without departing from the spirit and scope of the invention.

What is claimed is:

1. An RF receiver device containing a turbo decoder, the turbo decoder comprising:
   a systematic soft-bit data store configured to store systematic soft-bits;
   a processing unit configured to generate transmitter state metrics during a scan cycle of a decoding scan operation of the turbo decoder based on pairs of transmitter state metrics, the systematic soft bits, and a transmitter state transition trellis, wherein the pairs of transmitter state metrics are previously generated by the processing unit during a previous scan cycle of the decoding scan operation;
   a winning state determination module configured to compare the systematic soft bits with a bit pattern to generate branch metrics, wherein the bit pattern is associated with each transmitter state metric in one of the pairs of transmitter state metrics by the transmitter state transition trellis, and the winning state determination module further configured to determine a winning transmitter state metric and a non-winning transmitter state metric in the one of the pairs of transmitter state metrics based on the branch metrics; and
   a transmitter state data store configured to store the non-winning transmitter state metric and a winning transmitter state indicator that indicates which of the transmitter state metrics in the one of the pairs is the winning transmitter state metric.

2. The RF receiver device of claim 1, wherein the stored winning transmitter state indicator includes 1 bit for each pair.

3. The RF receiver device of claim 1, wherein the stored winning transmitter state indicator includes fewer bits than a transmitter state metric.

4. The RF receiver device of claim 1, wherein the transmitter state data store includes an insufficient number of memory storage cells to store the transmitter state metrics generated by the processing unit during the decoding scan operation.

5. The RF receiver device of claim 1, further comprising:
   a second processing unit that reconstitutes a transmitter state metric of a pair based on the stored winning transmitter state indicator, the transmitter transition trellis, and a metric for a prior transmitter state associated with each transmitter state metric in the pair by a trellis table.

6. The RF receiver device of claim 5, wherein the reconstituted transmitter state metric is the winning transmitter state metric that was not stored.

7. The RF receiver device of claim 1, wherein each branch metric provides a measure of similarity between the systematic bit and the bit pattern.

8. The RF receiver device of claim 7, wherein the transmitter state metric in the one of the pairs, associated with the branch metric indicating the greatest similarity between the systematic bit and the bit pattern, is selected as the winning transmitter state metric.

9. The RF receiver device of claim 1, wherein the non-winning transmitter state metric and the winning transmitter state indicator are generated and stored during a beta scan cycle.

10. The RF receiver device of claim 1, wherein the non-winning transmitter state metric and the winning transmitter state indicator are generated and stored during an alpha scan cycle.

11. An RF receiver device containing a turbo decoder, the turbo decoder comprising:
    a systematic soft-hit data store configured to store systematic soft-bits;
    at least one decoder engine including a decoding processing unit configured to generate transmitter state metrics during a scan cycle of a decoding operation of the turbo decoder based on the transmitter state metrics, the systematic soft-bits, and a transmitter state transition trellis, wherein the transmitter state metrics are previously generated by the decoding processing unit during a previous scan cycle of the decoding operation;
    a winning state determination module configured to compare the systematic soft-bits with a bit pattern to generate branch metrics, wherein the bit pattern is associated with each transmitter state metric in one of the transmitter state metrics; and
    a transmitter state data store that is configured to store selected transmitter state metrics generated by the decoding processing unit and indicators of non-selected transmitter state metrics in a number of memory storage cells that is insufficient for storing all of the transmitter state metrics generated by the decoding processing unit during the scan cycle.

12. The RF receiver device of claim 11, wherein the decoding processing unit stores in the transmitter state data store one of the transmitter state metrics and one of the indicators of the non-selected transmitter state metrics in place of a pair of the transmitter state metrics generated by the decoding processing unit.

13. The RF receiver device of claim 12, wherein the stored one of the indicators includes fewer bits than the one of the transmitter state metrics.

14. The RF receiver device of claim 12, wherein the stored one of the indicators replaces the one of the transmitter state metrics with a single bit.

15. The RF receiver device of claim 12, wherein the at least one decoder engine further comprises:
    a second decoding processing unit that reconstitutes the one of the transmitter state metrics based on at least the stored one of the indicators, a transmitter prior-state metric, and the transmitter transition trellis.

16. The RF receiver device of claim 15, wherein the reconstituted transmitter state metric is a transmitter state metric that was not stored.

17. The RF receiver device of claim 11, wherein the decoder engine is a convolutional decoder engine.

18. The RF receiver device of claim 11, wherein the decoder engine is a recursive convolutional decoder engine.

19. The RF receiver device of claim 11, wherein the transmitter state metric and the indicators of the non-selected transmitter state metrics are generated and stored during a beta scan cycle.

20. The RF receiver device of claim 11, wherein the transmitter state metric and the indicators of the non-selected transmitter state metrics are generated and stored during an alpha scan cycle.

21. A method for a decoder hardware performing a soft-bit decoding scan cycle of a decoding scan operation, comprising:
    defining a plurality of state pairs, the states within a state pair being connected by trellis branches to a common prior-state;
    comparing a systematic soft-bit stored in the decoder hardware and a bit pattern of one of the trellis branches;
    determining a metric for the one of the trellis branches between the states in the state pair and the common prior-state based on the comparison;
    determining a winning trellis branch metric based on the determined trellis branch metrics;
    determining a winning state and a losing state based on the determined winning trellis branch metric;
    determining a prior-state metric based on the winning state metric and the winning trellis branch metric; and
    storing the losing state metric and an indicator of the winning state metric.

22. The method of claim 21, wherein the state metric and the indicator of the winning state metric are stored in a data store that has an insufficient number of memory storage cells to store all transmitter state metrics generated by the decoder hardware during a decoding scan operation.

23. The method of claim 21, wherein determining a winning trellis branch includes comparing two determined trellis branch metrics and selecting the trellis branch with the highest trellis branch metric as the winning trellis branch.

24. The method of claim 21, wherein the winning state indicator is a single bit.

25. The method of claim 21, wherein the winning state indicator identifies a position of the winning state within the state pair.

26. The method of claim 21, wherein determining a prior-state metric includes adding the winning state metric and the winning trellis branch metric.

27. A method for a decoder hardware performing a soft-bit decoding scan cycle of a decoding scan operation, comprising:
    defining a plurality of transmitter prior-state pairs, each prior-state within a prior-state pair connected by trellis branches to a common pair of states;
    retrieving a state metric and a winning state indicator, for the common pair of states;
    comparing a systematic soft-bit stored in the decoder hardware and a bit pattern of one of the trellis branches;
    determining a metric for the one of the trellis branches between a selected prior-state of the prior-state pair and the winning state identified by the winning state indicator based on the comparison; and
    determining a metric for the winning state based on the selected prior-state and the determined trellis branch metric.

28. The method of claim 27, wherein determining a metric for the winning state based on the selected prior-state and the determined trellis branch metric includes subtracting the determined trellis branch metric from a selected prior-state metric.

* * * * *